US012599045B2

(12) United States Patent　　(10) Patent No.:　US 12,599,045 B2

Chang et al.　　(45) Date of Patent:　　Apr. 7, 2026

(54) SENSOR CHIPS HAVING COLUMNAR MICROSTRUCTURES EMBEDDED AND SURROUNDED BY ADHESIVE LAYER IN A PACKAGE STRUCTURE AND MANUFACTURING METHOD THEREOF

(71) Applicant: TONG HSING ELECTRONIC INDUSTRIES, LTD., Taipei City (TW)

(72) Inventors: Chia-Shuai Chang, Hsin-Chu County (TW); Wen-Fu Yu, Taipei City (TW); Bae-Yinn Hwang, Taipei City (TW); Wei-Li Wang, Taipei City (TW); Chien-Hung Lin, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 401 days.

(21) Appl. No.: 18/206,132

(22) Filed: Jun. 6, 2023

(65) Prior Publication Data

US 2024/0128233 A1　　Apr. 18, 2024

Related U.S. Application Data

(60) Provisional application No. 63/416,721, filed on Oct. 17, 2022.

(30) Foreign Application Priority Data

Mar. 8, 2023　　(TW) ................................. 112108427

(51) Int. Cl.
　　*H10W 72/30*　　　(2026.01)
　　*H10P 52/00*　　　(2026.01)
　　　　　　(Continued)

(52) U.S. Cl.
　　CPC ............. *H10W 90/00* (2026.01); *H10P 52/00* (2026.01); *H10W 72/072* (2026.01);
　　　　　　(Continued)

(58) Field of Classification Search
　　CPC . H01L 21/3043; H01L 21/78; H01L 23/3114; H01L 23/3142; H01L 24/13;
　　　　　　(Continued)

(56) References Cited

U.S. PATENT DOCUMENTS

| 6,995,462 B2 * | 2/2006 | Bolken et al. ................. 257/680 |
| 10,988,642 B2 * | 4/2021 | Liu et al. .................. C09J 7/38 |
| (Continued) | | |

FOREIGN PATENT DOCUMENTS

KR　　　101080612 B1 * 11/2011　　......... H01L 21/3065

*Primary Examiner* — Wael M Fahmy
*Assistant Examiner* — Alice W Tang
(74) *Attorney, Agent, or Firm* — Li & Cai Intellectual Property (USA) Office

(57) ABSTRACT

A sensor package structure and a manufacturing method thereof are provided. The sensor package structure includes a substrate, a fixing adhesive layer disposed on the substrate, a sensor chip adhered to the fixing adhesive layer, an annular adhering layer disposed on the sensor chip, a light-permeable sheet adhered to the annular adhering layer, and a plurality of metal wires that are electrically coupled to the substrate and the sensor chip. The size of the light-permeable sheet is smaller than that of the sensor chip.

9 Claims, 12 Drawing Sheets

(51) Int. Cl.

| | |
|---|---|
| *H10W 72/00* | (2026.01) |
| *H10W 72/20* | (2026.01) |
| *H10W 72/50* | (2026.01) |
| *H10W 74/10* | (2026.01) |
| *H10W 90/00* | (2026.01) |
| H10P 54/00 | (2026.01) |

(52) U.S. Cl.
CPC ....... *H10W 72/073* (2026.01); *H10W 72/075* (2026.01); *H10W 72/20* (2026.01); *H10W 72/30* (2026.01); *H10W 72/50* (2026.01); *H10W 74/127* (2026.01); *H10W 74/129* (2026.01)

(58) Field of Classification Search
CPC ......... H01L 24/29; H01L 24/48; H01L 24/81; H01L 24/85; H01L 25/0655; H10F 39/804
See application file for complete search history.

(56) References Cited

U.S. PATENT DOCUMENTS

| | | | |
|---|---|---|---|
| 2008/0191333 A1* | 8/2008 | Yang et al. ................... | 257/680 |
| 2012/0228681 A1* | 9/2012 | Lin et al. ..................... | 257/290 |
| 2022/0310399 A1* | 9/2022 | Nakane et al. ....... | H01L 21/304 |

* cited by examiner

S100 preparing step —S110 first bonding step —S120 slicing step —S130 second bonding step —S140 packaging step —S150

SENSOR CHIPS HAVING COLUMNAR MICROSTRUCTURES EMBEDDED AND SURROUNDED BY ADHESIVE LAYER IN A PACKAGE STRUCTURE AND MANUFACTURING METHOD THEREOF

CROSS-REFERENCE TO RELATED PATENT APPLICATION

This application claims the benefit of priority to Taiwan Patent Application No. 112108427, filed on Mar. 8, 2023. The entire content of the above identified application is incorporated herein by reference.

This application claims the benefit of priority to the U.S. Provisional Patent Application Ser. No. 63/416,721 filed on Oct. 17, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure and a manufacturing method thereof.

BACKGROUND OF THE DISCLOSURE

Based on an existing structural configuration of a conventional sensor package structure, the conventional sensor package structure is manufactured by fixing a sensor chip onto a substrate and then assembling a light-permeable sheet to the sensor chip. However, before the light-permeable sheet is assembled to the sensor chip, a sensing region of the sensor chip is easily contaminated or damaged in a manufacturing process or before a packaging process, thereby reducing the accuracy and yield rate of the sensing region.

SUMMARY OF THE DISCLOSURE

In response to the above-referenced technical inadequacies, the present disclosure provides a sensor package structure and a manufacturing method thereof for effectively improving on the issues associated with conventional sensor package structures and conventional manufacturing methods thereof.

In order to solve the above-mentioned problems, one of the technical aspects adopted by the present disclosure is to provide a manufacturing method of a sensor package structure, which includes a preparing step, a first bonding step, a slicing step, and a second bonding step. The preparing step is implemented by providing a wafer and a plurality of light-permeable sheets that are separate from each other. The wafer defines a plurality of sensor chips connected to each other, and a size of each of the sensor chips is greater than a size of any one of the light-permeable sheets. The first bonding step is implemented by adhering a top surface of each of the sensor chips with one of the light-permeable sheets by having an annular adhering layer sandwiched therebetween. Each of the sensor chips, the corresponding annular adhering layer, and the corresponding light-permeable sheet are jointly defined as a sensing module and jointly define an enclosed space therein. In any one of the sensing modules, a sensing region of the sensor chip is arranged in the enclosed space, and a plurality of connection pads of the sensor chip are arranged outside of the annular adhering layer. The slicing step is implemented by holding and slicing the wafer to separate the sensing modules from each other. The second bonding step is implemented by fixing one of the sensing modules onto an upper surface of a substrate and wire-bonding a plurality of bonding pads of the substrate and the connection pads of the one of the sensing modules through metal wires.

In order to solve the above-mentioned problems, another one of the technical aspects adopted by the present disclosure is to provide a sensor package structure, which includes a substrate, a fixing adhesive layer, a sensing module, and a plurality of metal wires. The substrate has a module-fixing region arranged on an upper surface thereof and a plurality of bonding pads that are arranged on the upper surface and that are located outside of the module-fixing region. The fixing adhesive layer is disposed on the module-fixing region of the substrate. The sensing module is fixed to the substrate through the fixing adhesive layer, and includes a sensor chip, an annular adhering layer, and a light-permeable sheet. The sensor chip is adhered to the fixing adhesive layer through a bottom surface thereof. The bottom surface of the sensor chip has a plurality of columnar microstructures embedded in the fixing adhesive layer, and a top surface of the sensor chip includes a sensing region and a plurality of connection pads that are arranged outside of the sensing region. The annular adhering layer is disposed on the top surface of the sensor chip. The annular adhering layer surrounds the sensing region, and the connection pads are located outside of the annular adhering layer. The light-permeable sheet is disposed on the annular adhering layer. The light-permeable sheet, the annular adhering layer, and the sensor chip jointly define an enclosed space, and a projection region defined by orthogonally projecting the light-permeable sheet onto the top surface of the sensor chip is located inside of the connection pads by a distance. The metal wires are respectively connected to the bonding pads of the substrate and the connection pads of the sensor chip so as to establish an electrical connection between the substrate and the sensor chip.

In order to solve the above-mentioned problems, yet another one of the technical aspects adopted by the present disclosure is to provide a sensor package structure, which includes a substrate, a fixing adhesive layer, a sensing module, and a plurality of metal wires. The substrate has a module-fixing region arranged on an upper surface thereof and a plurality of bonding pads that are arranged on the upper surface and that are located outside of the module-fixing region. The fixing adhesive layer is disposed on the module-fixing region of the substrate. The sensing module is fixed to the substrate through the fixing adhesive layer, and includes a sensor chip, an annular adhering layer, and a light-permeable sheet. The sensor chip is adhered to the fixing adhesive layer through a bottom surface thereof. Moreover, a top surface of the sensor chip includes a sensing region and a plurality of connection pads that are arranged outside of the sensing region. The annular adhering layer is disposed on the top surface of the sensor chip. The annular adhering layer surrounds the sensing region, and the connection pads are located outside of the annular adhering layer. The light-permeable sheet is disposed on the annular adhering layer. The light-permeable sheet, the annular adhering layer, and the sensor chip jointly define an enclosed space, and a projection region defined by orthogonally projecting the light-permeable sheet onto the top surface of the sensor chip is located inside of the connection pads by a distance. The metal wires are respectively connected to the bonding pads of the substrate and the connection pads of the sensor chip so as to establish an electrical connection between the substrate and the sensor chip.

Therefore, the manufacturing method of the present disclosure can be implemented by adhering the light-permeable sheet having a smaller size onto the sensor chip to jointly form the sensing module (e.g., the light-permeable sheet and the annular adhering layer are used to surround the sensing region) so as to arrange the sensing region of the sensor chip in the enclosed space of the sensing module, and then fixing the sensing module onto the substrate, thereby effectively preventing the sensing region of the sensor chip from being contaminated or damaged in a manufacturing process of the sensor package structure.

Moreover, in the sensing module of the sensor package structure provided by the present disclosure, an expansion part generated from the annular adhering layer having a larger coefficient of thermal expansion (CTE) can be received in the enclosed space, thereby preventing the light-permeable sheet or the sensing region from being damaged and squeezed by the expansion part.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
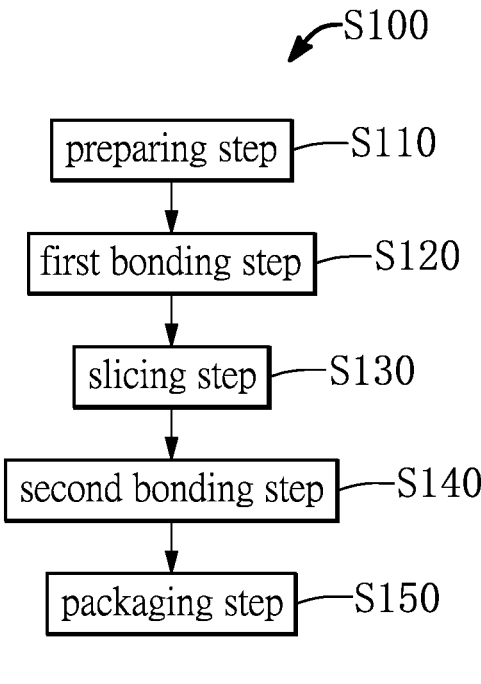
FIG. 1 is a flowchart showing a manufacturing method of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure is provided. As shown in FIG. 1, the present embodiment provides a manufacturing method S100 of a sensor package structure, which includes (or is implemented by) a preparing step S110, a first bonding step S120, a slicing step S130, a second bonding step S140, and a packaging step S150.

The present embodiment sequentially describes the steps S110-S150 of the manufacturing method S100, but the present disclosure is not limited thereto. For example, in other embodiments of the present disclosure not shown in the drawings, any one of the steps S110-S150 of the manufacturing method S100 can be adjusted, added, or canceled (e.g., the packaging step S150 can be omitted according to design requirements).

Figure 2:
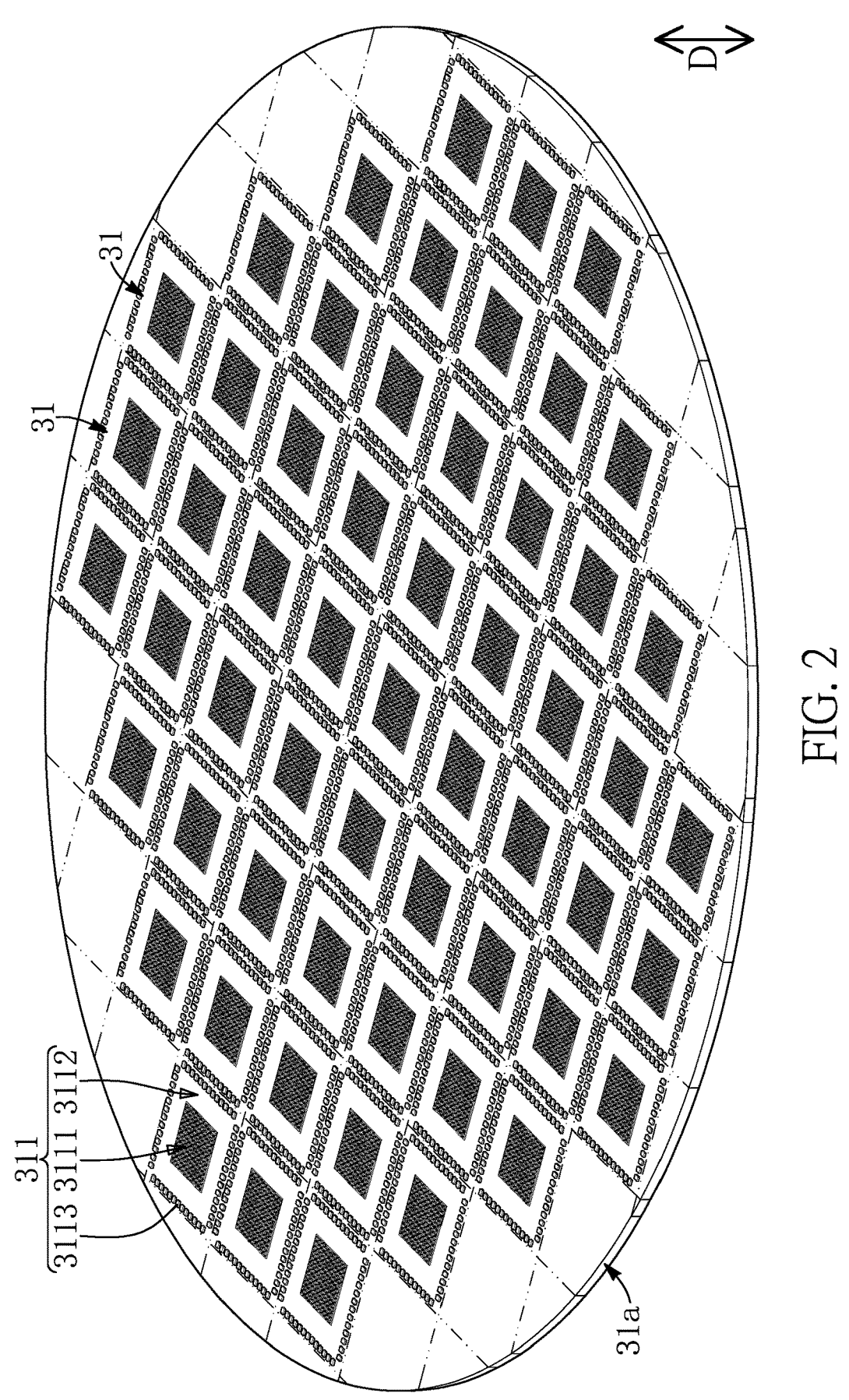
FIG. 2 is a schematic perspective view showing a preparing step of FIG. 1.
Figure 3:
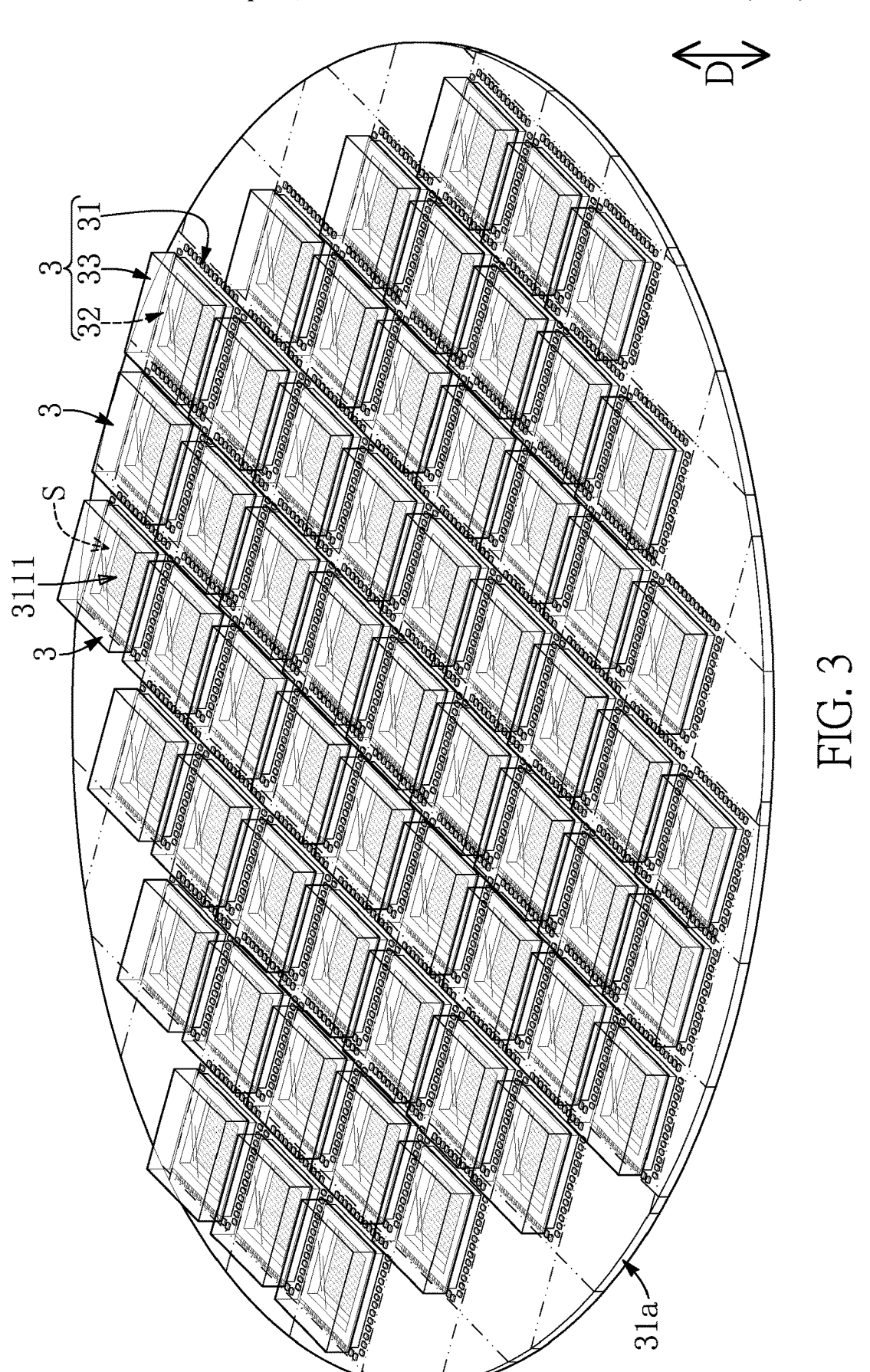
FIG. 3 is a schematic perspective view showing a first bonding step of FIG. 1.

As shown in FIG. 1 to FIG. 3, the preparing step S110 is implemented by providing a wafer 31*a* and a plurality of light-permeable sheets 33 that are separate from each other. The wafer 31*a* defines a plurality of sensor chips 31 (integrally) connected to each other, and a size of each of the sensor chips 31 is greater than a size of any one of the light-permeable sheets 33. The light-permeable sheets 33 are limited to being unconnected to each other, and any one of the light-permeable sheets 33 in the present embodiment is an individual component and can be a flat piece of glass, but the present disclosure is not limited thereto. In other words, any light-permeable sheet having a size greater than or equal to a size of the sensor chip 31 is different from the light-permeable sheet 33 of the present embodiment.

As shown in FIG. 1 and FIG. 3, the first bonding step S120 is implemented by adhering a top surface 311 of each of the sensor chips 31 with one of the light-permeable sheets 33 by having an annular adhering layer 32 sandwiched therebetween. Each of the sensor chips 31, the corresponding annular adhering layer 32, and the corresponding light-permeable sheet 33 are jointly defined as a sensing module 3 and jointly define an enclosed space S therein. Moreover, in any one of the sensing modules 3, a sensing region 3111 of the sensor chip 31 is arranged in the enclosed space S, and a plurality of connection pads 3113 of the sensor chip 31 are arranged outside of the annular adhering layer 32.

Furthermore, in any one of the sensing modules 3, the annular adhering layer 32 can be adhered to the top surface 311 of the sensor chips 31, and then the light-permeable sheets 33 is adhered to the annular adhering layer 32; or, the annular adhering layer 32 can be adhered to the light-permeable sheets 33, and then the light-permeable sheets 33 is adhered to the top surface 311 of the sensor chips 31 through the annular adhering layer 32; or, a glass board and a glue layer formed thereon are sliced to form the light-permeable sheets 33 and the annular adhering layers 32 respectively adhered thereon (e.g., before the first bonding step S120, the light-permeable sheets 33 can be provided by the glass board that is not sliced yet), and then any one of the light-permeable sheets 33 is adhered to the top surface 311 of one of the sensor chips 31 through the annular adhering layer 32, but the present disclosure is not limited thereto.

Figure 7:
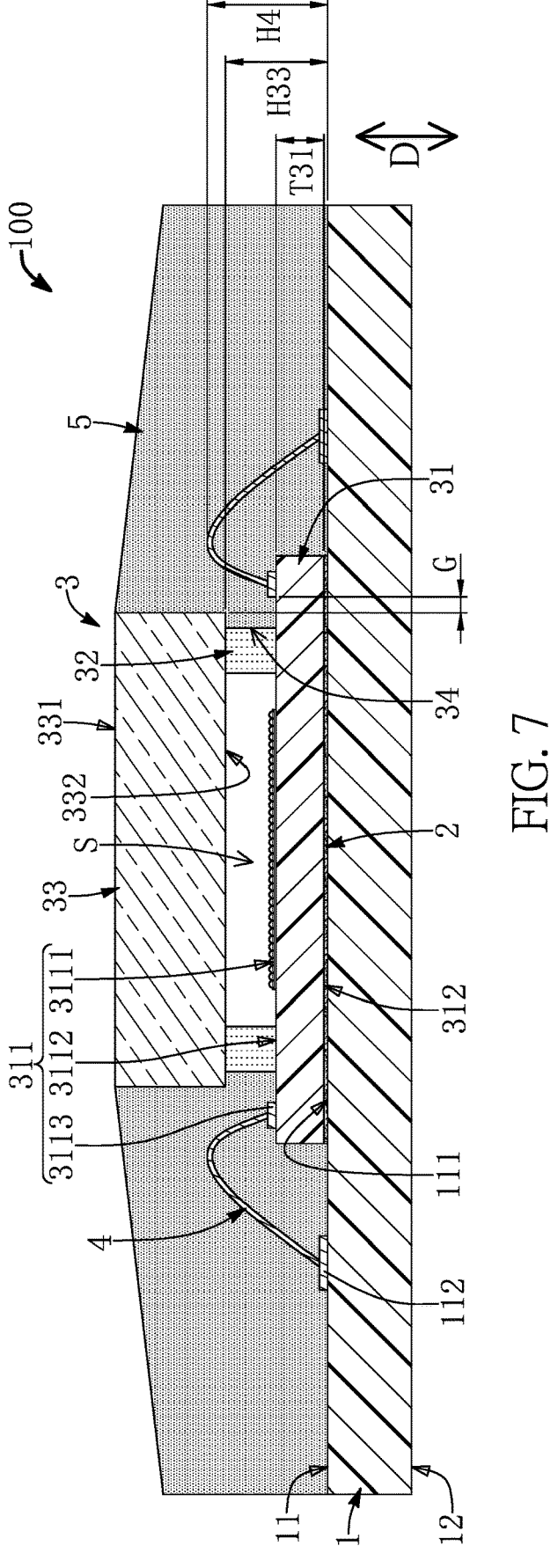
FIG. 7 is a schematic cross-sectional view taken along line VII-VII of FIG. 6.

Specifically, in each of the sensing modules 3, a projection region defined by orthogonally projecting the light-permeable sheet 33 onto the top surface 311 of the sensor chip 31 is located inside of the connection pads 3113 and is spaced apart from each of the connection pads 3113 by a distance G (shown in FIG. 7). In other words, any configuration not meeting the above connection relationship of the light-permeable sheet 33 and the sensor chip 31 is different from the sensing module 3 of the present embodiment.

Figure 4:
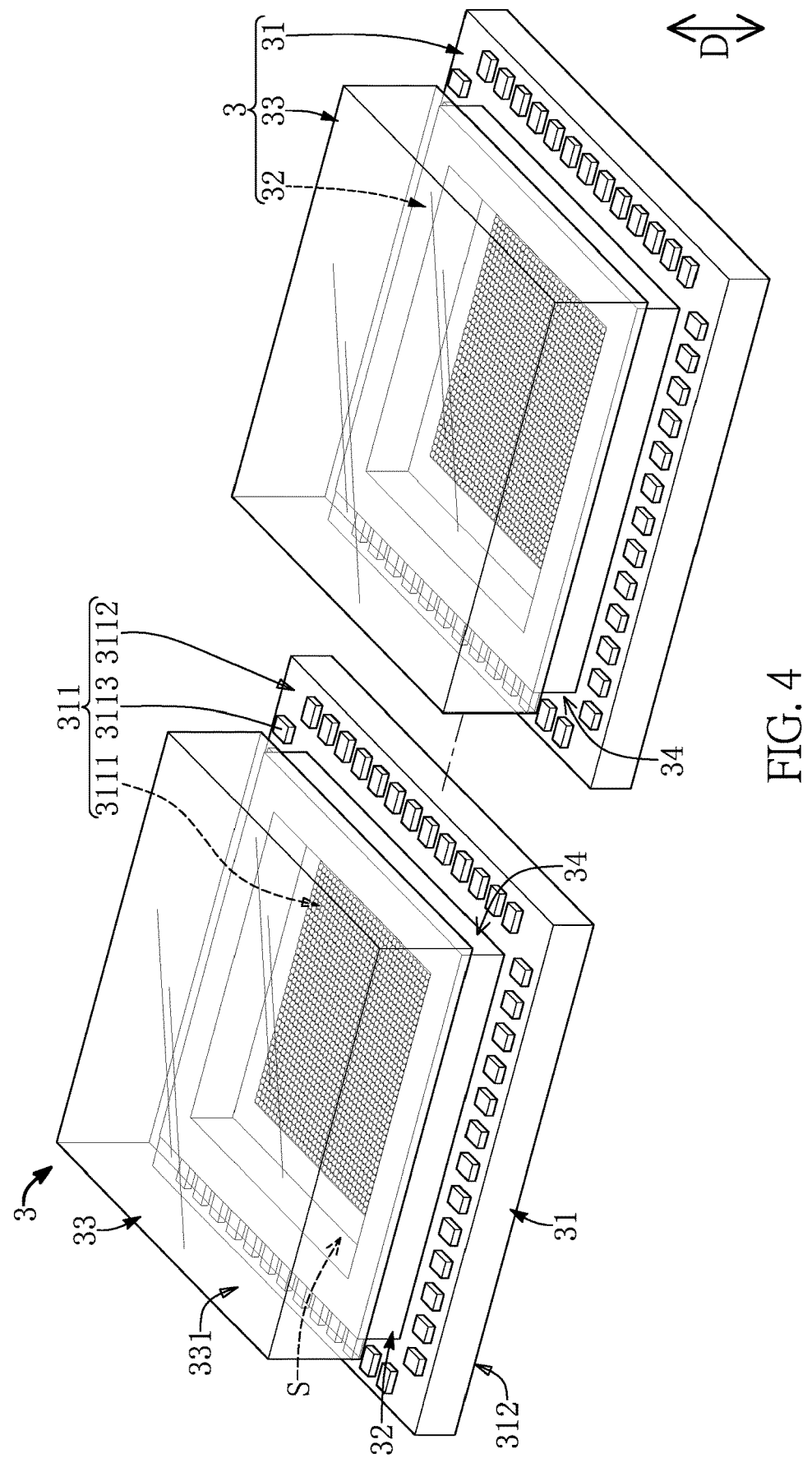
FIG. 4 is a schematic perspective view showing a slicing step of FIG. 1.

As shown in FIG. 1, FIG. 3, and FIG. 4, the slicing step S130 is implemented by holding and slicing the wafer 31*a* to separate the sensing modules 3 from each other. In the present embodiment, the light-permeable sheets 33 are spaced from each other through a checkerboard-like channel, so that a slicing tool or a laser beam (not shown in the drawings) can pass through and move along the checkerboard-like channel to slice the wafer 31*a*. In other words, the light-permeable sheets 33 in the slicing step S130 are not in contact with the slicing tool.

It should be noted that the slicing step S130 in the present embodiment is limited to be implemented by slicing a single component (e.g., the wafer 31*a*), thereby preventing the relative position between the components of each of the sensing modules 3 from being affected due to more than one of the components of each of the sensing modules 3 being sliced. Accordingly, any slicing process implemented by slicing at least two components is different from the slicing step S 130 of the present embodiment.

Figure 5:
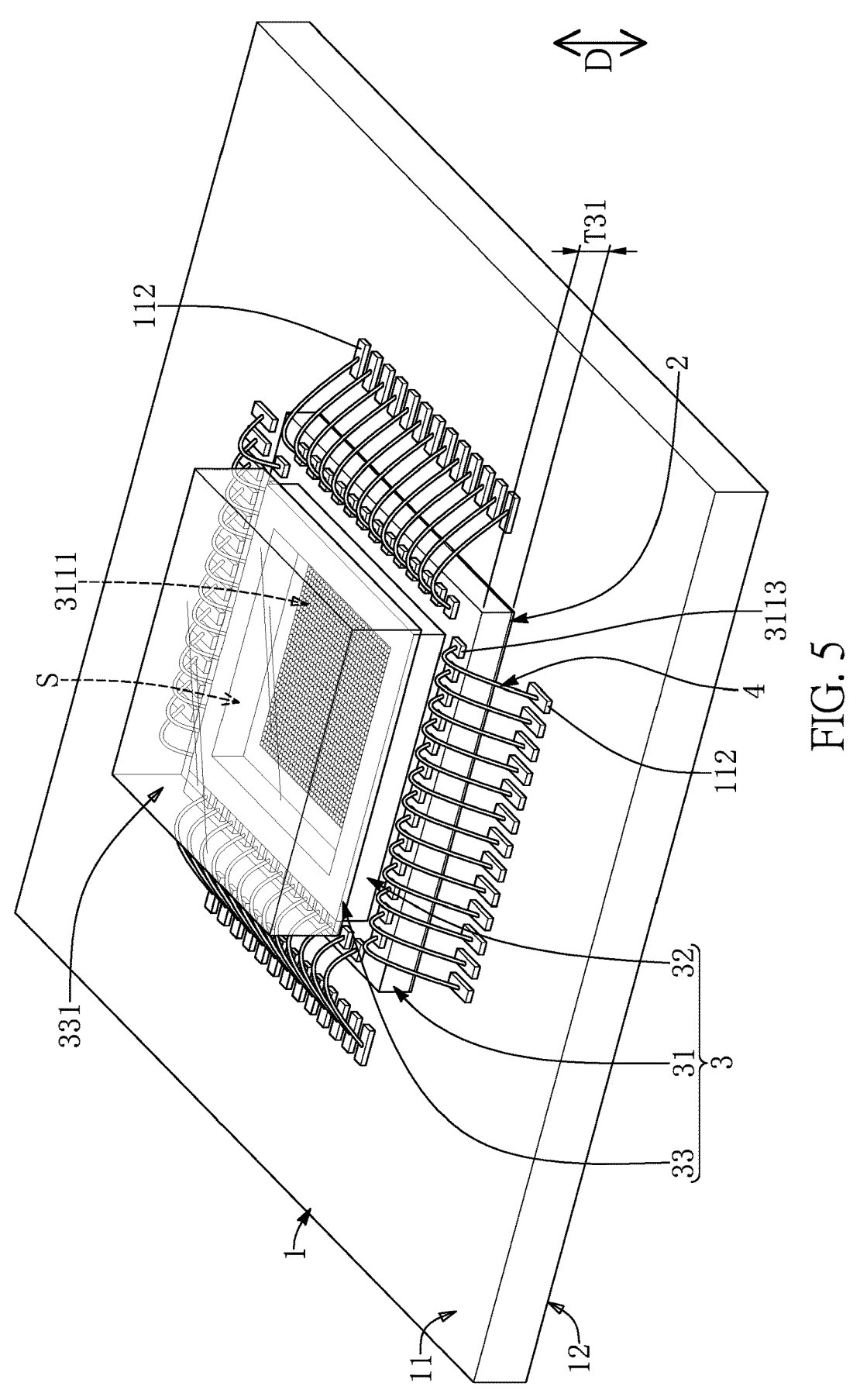
FIG. 5 is a schematic perspective view showing a second bonding step of FIG. 1.

As shown in FIG. 1 and FIG. 5, the second bonding step S140 is implemented by fixing one of the sensing modules 3 onto an upper surface 11 of a substrate 1 and wire-bonding a plurality of bonding pads 112 of the substrate 1 and the connection pads 3113 of the one of the sensing modules 3 through metal wires 4. In the present embodiment, the one of the sensing modules 3 is fixed onto the upper surface 11 of the substrate 1 through a fixing adhesive layer 2.

Specifically, in the one of the sensing modules 3, a bottom surface 312 of the sensor chip 31 is not grinded and is fixed onto the upper surface 11 of the substrate 1, and a thickness T31 of the sensor chip 31 has a maximum acceptable value of 700 μm. Accordingly, since the sensor chip 31 does not need to be grinded to reduce the thickness thereof, the sensor chip 31 can have a higher heat capacity for allowing the sensor chip 31 to slowly increase in temperature during operation, thereby effectively increasing a signal-to-noise ratio (SNR) of the sensor chip 31.

Figure 6:
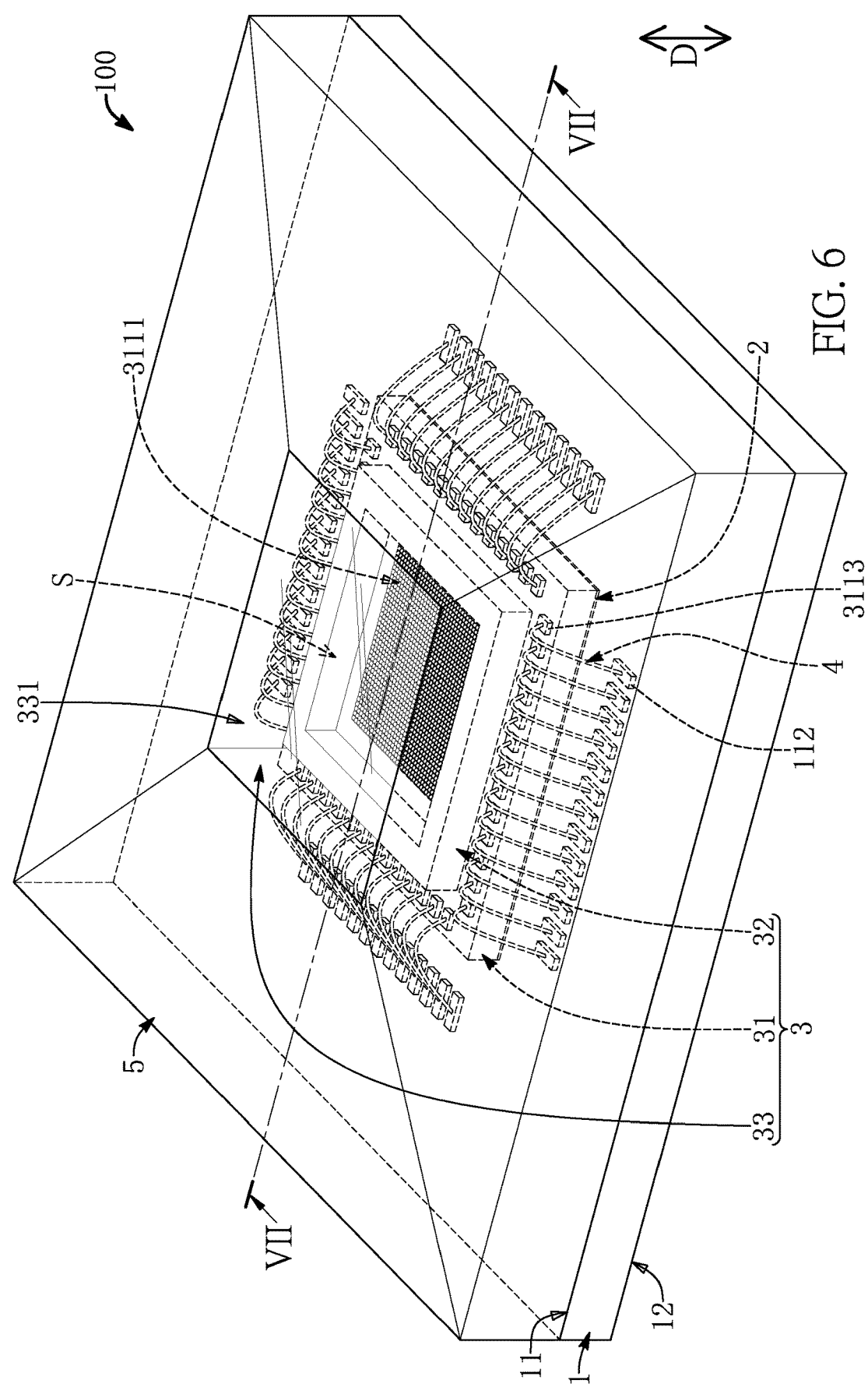
FIG. 6 is a schematic perspective view showing a packaging step of FIG. 1.

As shown in FIG. 1, FIG. 6, and FIG. 7, the packaging step S150 is implemented by forming an encapsulant 5 on the upper surface 11 of the substrate 1. Moreover, the metal wires 4 and the one of the sensing modules 3 are embedded in the encapsulant 5, and an outer surface 331 of the light-permeable sheets 33 of the one of the sensing modules 3 is at least partially exposed from the encapsulant 5. Accordingly, after the packaging step S150 is implemented, a sensor package structure 100 provided by the present embodiment can be obtained. Furthermore, the substrate 1 is provided without any solder ball disposed on a lower surface 12 thereof, thereby reducing a thickness of the sensor package structure 100.

In summary, the manufacturing method S100 of the present embodiment can be implemented by adhering the light-permeable sheet 33 having a smaller size onto the sensor chip 31 to jointly form the sensing module 3 so as to arrange the sensing region 3111 of the sensor chip 31 in the enclosed space S of the sensing module 3, and then fixing the sensing module 3 onto the substrate 1, thereby effectively preventing the sensing region 3111 of the sensor chip 31 from being contaminated or damaged in a manufacturing process of the sensor package structure 100.

In addition, the above description substantially describes the manufacturing method S100 of the present embodiment, and the following description substantially describes a specific configuration of the sensor package structure 100 provided by the present embodiment. The sensor package structure 100 is preferably prepared by implementing the manufacturing method S100 of the present embodiment, but the present disclosure is not limited thereto.

As shown in FIG. 6 and FIG. 7, the sensor package structure 100 in the present embodiment includes a substrate 1, a fixing adhesive layer 2 disposed on the substrate 1, a sensing module 3 fixed to the substrate 1 through the fixing adhesive layer 2, a plurality of metal wires 4 electrically coupled to the substrate 1 and the sensing module 3, and an encapsulant 5 that is formed on the substrate 1, but the present disclosure is not limited thereto.

The substrate 1 of the present embodiment has a square shape or a rectangular shape, but the present disclosure is not limited thereto. An upper surface 11 of the substrate 1 includes a module-fixing region 111 arranged approximately on a center portion thereof, and the substrate 1 includes a plurality of bonding pads 112 arranged outside of the module-fixing region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the module-fixing region 111.

In addition, the substrate 1 can be provided without any solder ball disposed on a lower surface 12 thereof. In other words, the sensor package structure 100 can be soldered onto an electronic component (not shown in the drawings) through the lower surface 12 of the substrate 1, but the present disclosure is not limited thereto. For example, in other embodiments of the present disclosure not shown in the drawings, the substrate 1 can be further provided with solder balls disposed on the lower surface 12 thereof according to design requirements.

The fixing adhesive layer 2 is disposed on the module-fixing region 111 of the substrate 1. In other words, the fixing adhesive layer 2 is located inside of the bonding pads 112, so that the sensing module 3 can be fixed to the module-fixing region 111 of the substrate 1 along a predetermined direction D through the fixing adhesive layer 2. It should be noted that the sensing module 3 in the present embodiment is entirely adhered to the substrate 1, which is different from a configuration formed by sequentially assembling multiple components to the substrate 1.

Specifically, the sensing module 3 includes a sensor chip 31, an annular adhering layer 32 disposed on the sensor chip 31, and a light-permeable sheet 33 that is disposed on the annular adhering layer 32. Moreover, a size of the light-permeable sheet 33 (e.g., an area that is surrounded by an outer contour of the light-permeable sheet 33) is greater than a size of the annular adhering layer 32, and is smaller than a size of the sensor chip 31, so that an outer lateral edge of the annular adhering layer 32, the sensor chip 31, and the light-permeable sheet 33 jointly define an annular groove 34.

The sensor chip 31 in the present embodiment has a square shape or a rectangular shape and is an image sensor chip, and a thickness T31 of the sensor chip 31 has a maximum acceptable value of 700 μm, but the present disclosure is not limited thereto. Moreover, a bottom surface 312 of the sensor chip 31 is fixed onto the fixing adhesive layer 2. In other words, the sensor chip 31 is arranged to be surrounded on the inside of the bonding pads 112. Moreover, a top surface 311 of the sensor chip 31 has a sensing region 3111 and a carrying region 3112 that has a ring shape arranged around the sensing region 3111.

The sensor chip 31 includes a plurality of connection pads 3113 arranged on the carrying surface 3112. In other words, the carrying surface 3112 are arranged outside of the sensing region 3111. The number and positions of the connection pads 3113 of the sensor chip 31 in the present embodiment correspond to those of the bonding pads 112 of the substrate 1. In other words, the connection pads 3113 in the present embodiment are substantially in a ring-shaped arrangement.

The annular adhering layer 32 is disposed on the top surface 311 of the sensor chip 31 (e.g., the carrying region 3112), the annular adhering layer 32 surrounds the sensing region 3111, and the connection pads 3113 are located outside of the annular adhering layer 32. The annular adhering layer 32 is spaced apart from the sensing region 3111 by an interval, and is spaced apart from any one of the connection pads 3113 by another interval.

The light-permeable sheet 33 in the present embodiment is a transparent and flat glass board, but the present disclosure is not limited thereto. The light-permeable sheet 33 has an outer surface 331 and an inner surface 332 that is opposite to the outer surface 331. The inner surface 332 of the light-permeable sheet 33 is disposed on the annular adhering layer 32, so that the light-permeable sheet 33, the annular adhering layer 32, and the sensor chip 31 jointly define an enclosed space S. Moreover, the sensing region 3111 of the sensor chip 31 is located in the enclosed space S, and a projection region defined by orthogonally projecting the light-permeable sheet 33 along the predetermined direction D onto the top surface 311 of the sensor chip 31 is located inside of the connection pads 3113 by a distance G.

In summary, in the sensing module 3 of the sensor package structure 100 (e.g., the light-permeable sheet 33, the sensor chip 31, and the annular adhering layer 32 sandwiched therebetween) provided by the present embodiment, an expansion part generated from the annular adhering layer 32 having a larger coefficient of thermal expansion (CTE) can be received in the enclosed space S, thereby preventing the light-permeable sheet 33 or the sensing region 3111 from being damaged and squeezed by the expansion part.

The metal wires 4 are respectively connected to the bonding pads 112 of the substrate 1 and the connection pads 3113 of the sensor chip 31 (e.g., two ends of any one of the metal wires 4 are respectively connected to one of the bonding pads 112 and a corresponding one of the connection pads 3113) so as to establish an electrical connection between the substrate 1 and the sensor chip 31.

In the present embodiment, a bending point (e.g., a highest point) of any one of the metal wires 4 and the upper surface 11 of the substrate 1 have a largest distance H4 therebetween that is greater than an interval distance F33 between the light-permeable sheet 33 and (the upper surface 11 of) the substrate 1. In other words, the configuration of the sensing module 3 does not affect the following wire-bonding process of any one of the metal wires 4.

The encapsulant 5 of the present embodiment is opaque for blocking a visible light from passing therethrough. The encapsulant 5 is a liquid encapsulation and is formed on the upper surface 11 of the substrate 1, and edges of the encapsulant 5 are flush with edges of the substrate 1. The sensing module 3 and the metal wires 4 are embedded in the encapsulant 5, and the outer surface 331 of the light-permeable sheet 3 is at least partially exposed from the encapsulant 5, but the present disclosure is not limited thereto. Moreover, the connection strength of the sensing module 3 and the encapsulant 5 in the present embodiment can be effectively increased through the configuration of the sensing module 3 (e.g., the annular groove 34 is fully filled with the encapsulant 5).

Second Embodiment

Figure 8:
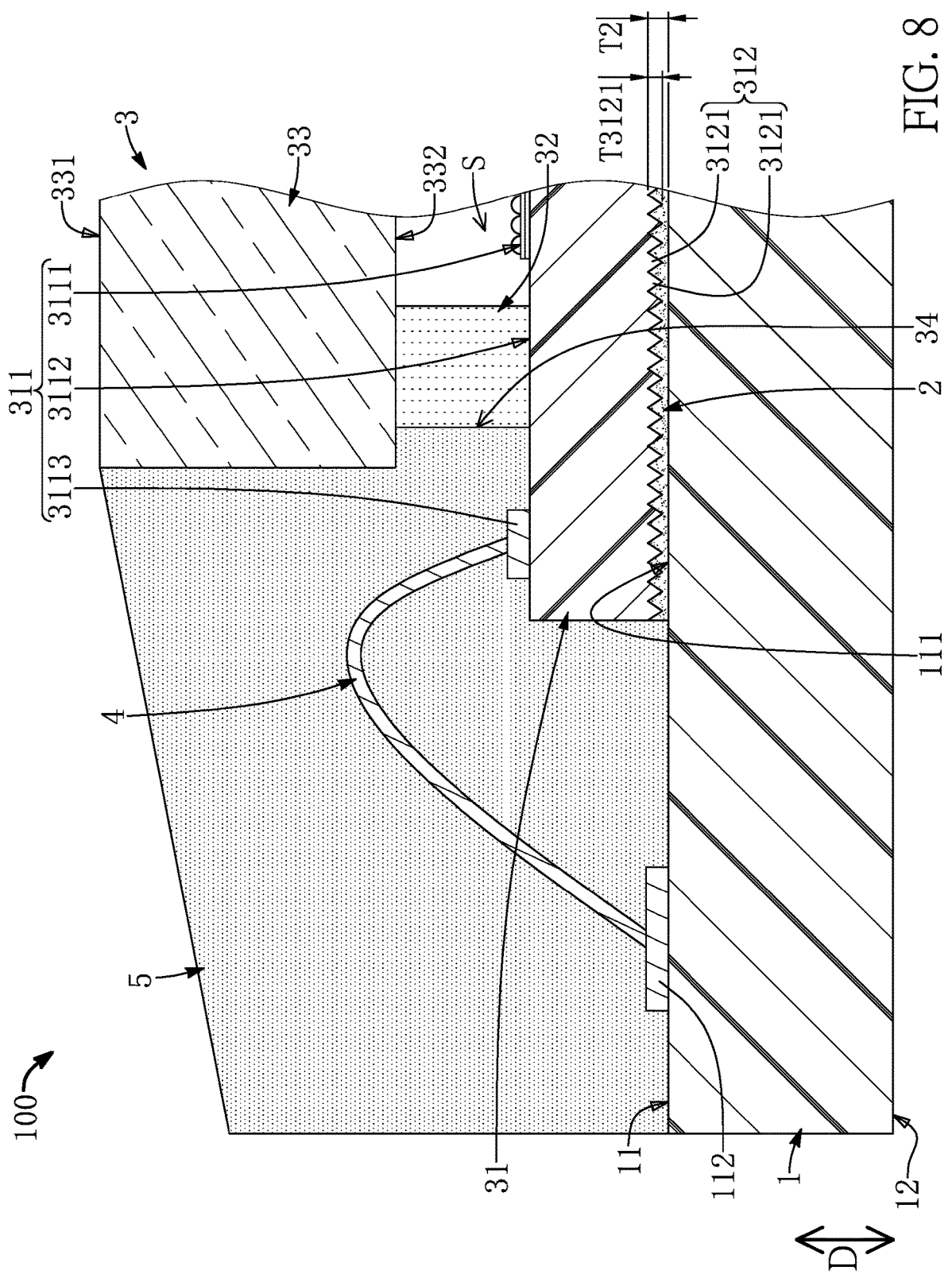
FIG. 8 is a partial schematic cross-sectional view showing the sensor package structure according to a second embodiment of the present disclosure.
Figure 9:
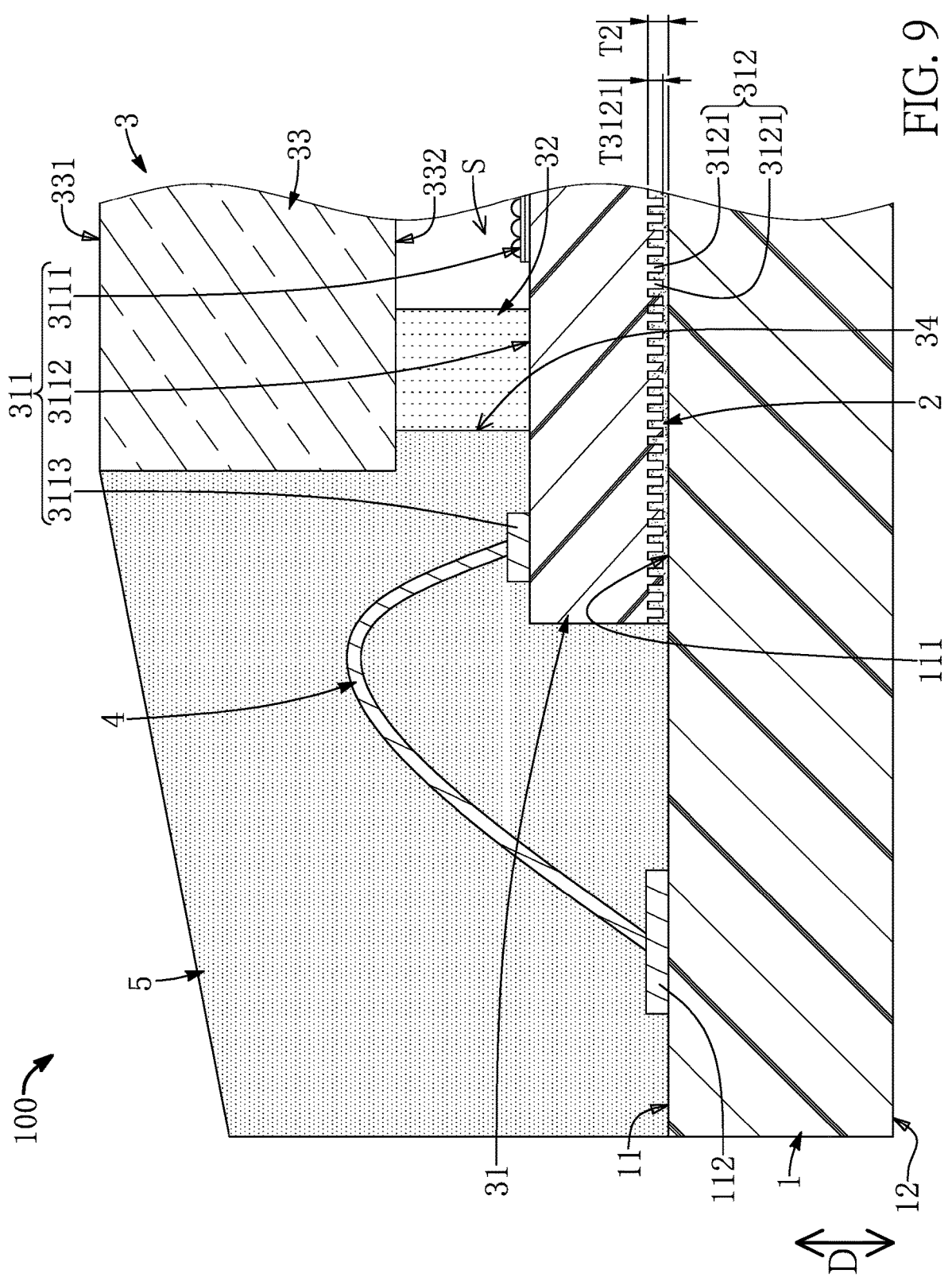
FIG. 9 is a partial schematic cross-sectional view showing the sensor package structure in another configuration according to the second embodiment of the present disclosure.
Figure 10:
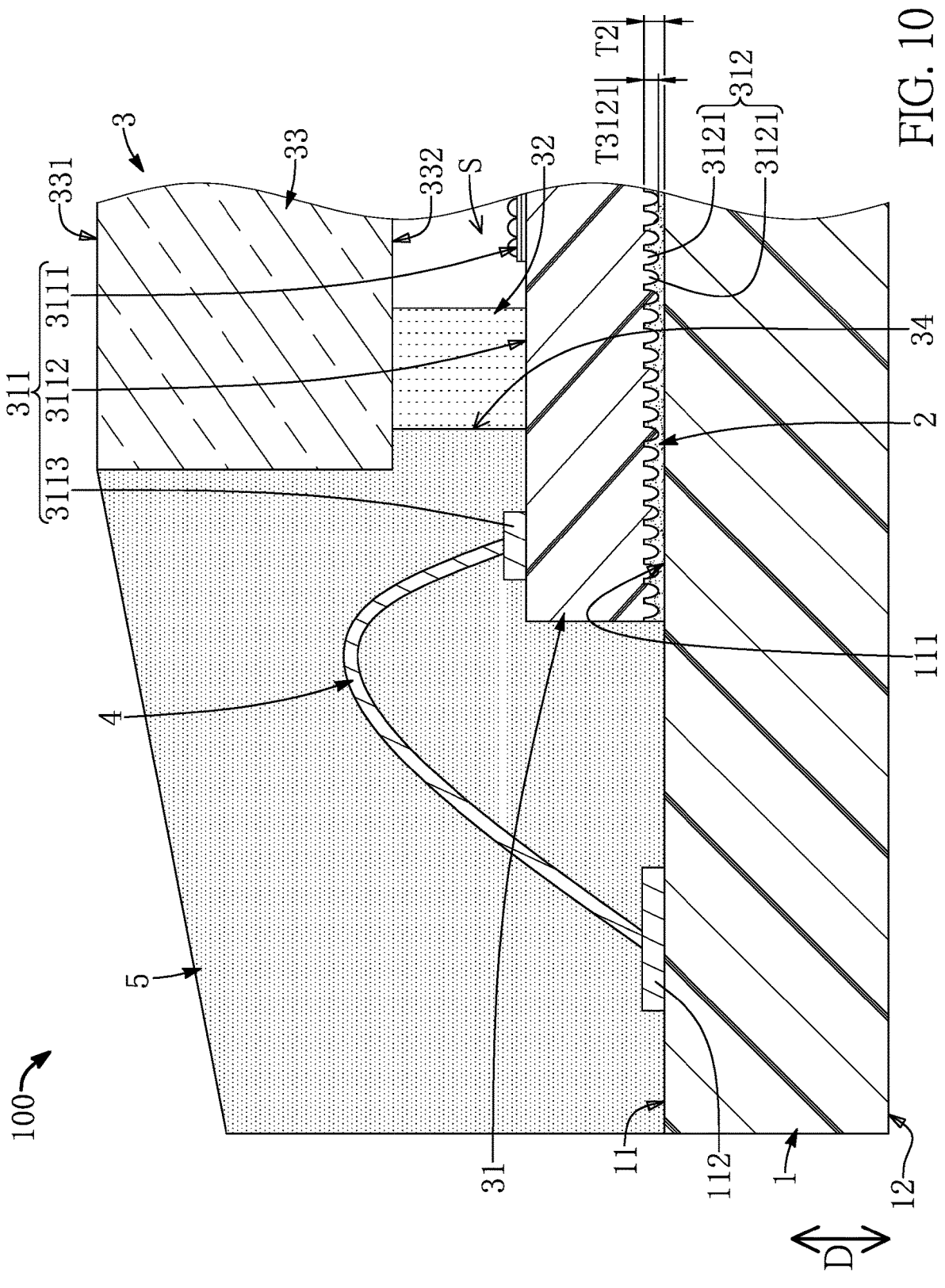
FIG. 10 is a partial schematic cross-sectional view showing the sensor package structure in yet another configuration according to the second embodiment of the present disclosure.

Referring to FIG. 8 to FIG. 10, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the bottom surface 312 of the sensor chip 31 has a plurality of columnar microstructures 3121. Moreover, in the second bonding step, the columnar microstructures 3121 of the sensor chip 31 are embedded in the fixing adhesive layer 2 and each can be adjusted or changed according to design requirements, but the present disclosure is not limited thereto. For example, each of the columnar microstructures 3121 can be a triangular column shown in FIG. 8, a circular column (or a rectangular column) shown in FIG. 9, or a spherical column shown in FIG. 10. Furthermore, a thickness T2 of the fixing adhesive layer 2 is greater than a thickness T3121 of any one of the columnar microstructures 3121, so that each of the columnar microstructures 3121 is entirely embedded in the fixing adhesive layer 2 and is not in contact with the substrate 1.

In summary, the sensor package structure 100 of the present embodiment is provided with the sensor chip 31 having the columnar microstructures 3121 embedded in the fixing adhesive layer 2, thereby further effectively increasing the connection strength of the sensing module 3 and the encapsulant 5.

Third Embodiment

Figure 11:
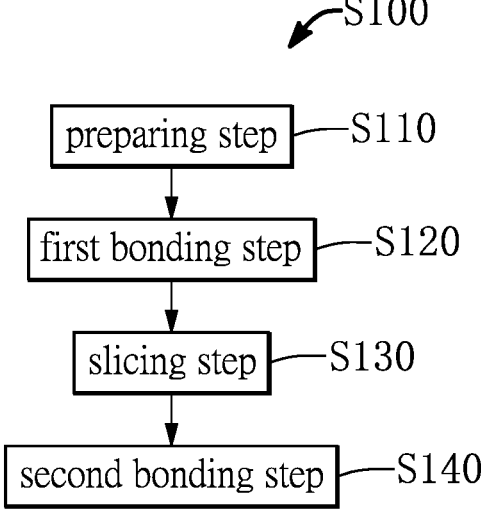
FIG. 11 is a flowchart showing the manufacturing method of the sensor package structure according to a third embodiment of the present disclosure.
Figure 12:
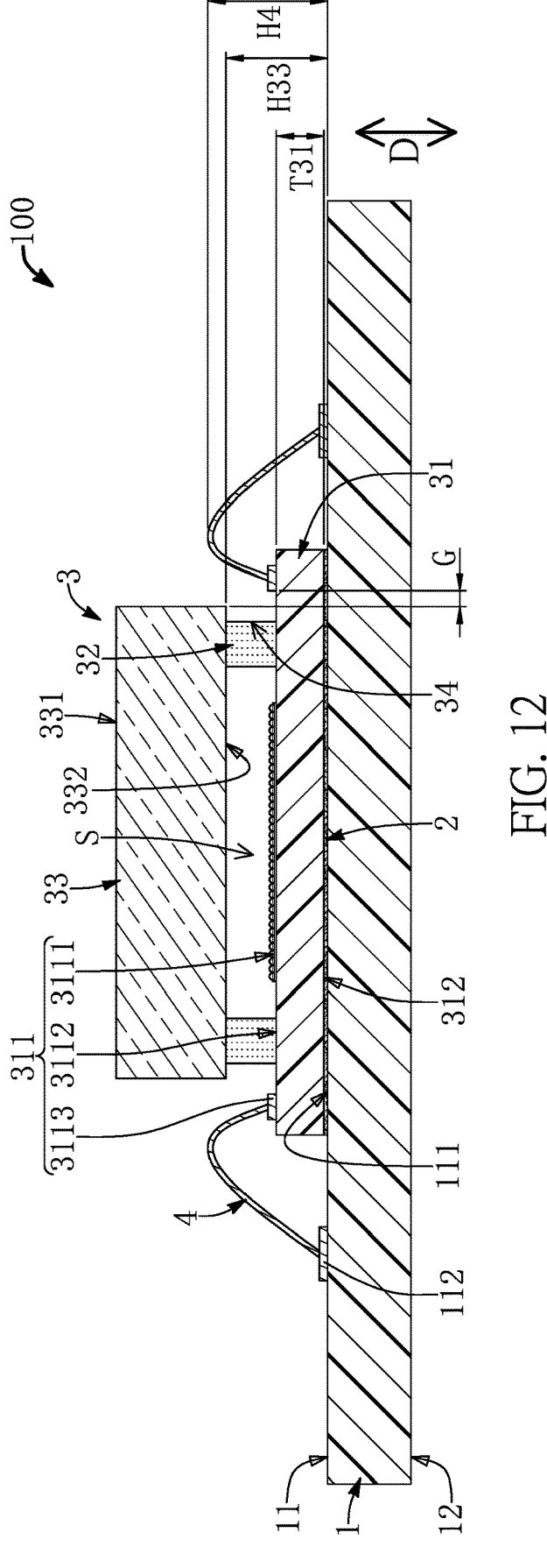
FIG. 12 is a schematic cross-sectional view showing the sensor package structure according to the third embodiment of the present disclosure.

Referring to FIG. 11 and FIG. 12, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the manufacturing method S100 can be provided without the packaging step according to design requirements. In other words, the sensor package structure 100 in the present embodiment does not have the encapsulant provided by the above embodiments according to design requirements. In addition, the encapsulant can be adjusted or changed according to design requirements. For example, in other embodiments of the present disclosure not shown in the drawings, the encapsulant can surround lateral sides of the light-permeable sheet 33 and does not cover any one of the metal wires 4 or only cover a part of any one of the metal wires 4.

Beneficial Effects of the Embodiments

In conclusion, the manufacturing method of the present disclosure can be implemented by adhering the light-permeable sheet having a smaller size onto the sensor chip to jointly form the sensing module so as to arrange the sensing region of the sensor chip in the enclosed space of the sensing module, and then fixing the sensing module onto the substrate, thereby effectively preventing the sensing region of the sensor chip from being contaminated or damaged in a manufacturing process of the sensor package structure.

Moreover, in the sensing module of the sensor package structure provided by the present disclosure, an expansion part generated from the annular adhering layer having a larger coefficient of thermal expansion (CTE) can be received in the enclosed space, thereby preventing the light-permeable sheet or the sensing region from being damaged and squeezed by the expansion part.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of a sensor package structure, comprising:

a preparing step implemented by providing a wafer and a plurality of light-permeable sheets that are separate from each other, wherein the wafer defines a plurality of sensor chips connected to each other, and a size of each of the sensor chips is greater than a size of any one of the light-permeable sheets, and wherein each one of the sensor chips has a sensing region formed on a top surface thereof and a plurality of columnar microstructures that are formed on a bottom surface thereof;

a first bonding step implemented by adhering the top surface of each of the sensor chips with one of the light-permeable sheets through an annular adhering layer sandwiched therebetween, wherein each of the sensor chips, the corresponding annular adhering layer, and the corresponding light-permeable sheet are jointly defined as a sensing module and jointly define an enclosed space therein, and wherein, in any one of the sensing modules, the sensing region of the sensor chip is arranged in the enclosed space, and a plurality of connection pads of the sensor chip are arranged outside of the annular adhering layer;

a slicing step implemented by holding and slicing the wafer to separate the sensing modules from each other; and a second bonding step implemented by fixing one of the sensing modules onto an upper surface of a substrate through a fixing adhesive layer and wire-bonding a plurality of bonding pads of the substrate and the connection pads of the one of the sensing modules through metal wires, wherein the columnar microstructures of the sensor chip of the one of the sensing modules are embedded in the fixing adhesive layer, where a thickness of the fixing adhesive layer is greater than a thickness of any one of the columnar microstructures such that the columnar microstructures are not in contact with the substrate.

2. The manufacturing method according to claim 1, wherein, in each of the sensing modules, a projection region defined by orthogonally projecting the light-permeable sheet onto the top surface of the sensor chip is located inside of the connection pads and is spaced apart from any of the connection pads by a distance.

3. The manufacturing method according to claim 1, wherein the substrate is provided without any solder ball disposed on a lower surface thereof.

4. The manufacturing method according to claim 1, further comprising a packaging step implemented by forming an encapsulant on the upper surface of the substrate, wherein the metal wires and the one of the sensing modules are embedded in the encapsulant, and an outer surface of the light-permeable sheets of the one of the sensing modules is at least partially exposed from the encapsulant.

5. A sensor package structure, comprising:

a substrate having a module-fixing region arranged on an upper surface thereof and a plurality of bonding pads that are arranged on the upper surface and that are located outside of the module-fixing region;

a fixing adhesive layer disposed on the module-fixing region of the substrate;

a sensing module fixed to the substrate through the fixing adhesive layer and including:

a sensor chip adhered to the fixing adhesive layer through a bottom surface thereof, wherein the bottom surface of the sensor chip has a plurality of columnar microstructures embedded in the fixing adhesive layer, and a top surface of the sensor chip includes a sensing region and a plurality of connection pads that are arranged outside of the sensing region, and wherein a thickness of the fixing adhesive layer is greater than a thickness of any one of the columnar microstructures, so that each of the columnar microstructures is not in contact with the substrate;

an annular adhering layer disposed on the top surface of the sensor chip, wherein the annular adhering layer surrounds the sensing region, and the connection pads are located outside of the annular adhering layer; and a light-permeable sheet disposed on the annular adhering layer, wherein the light-permeable sheet, the annular adhering layer, and the sensor chip jointly define an enclosed space, and a projection region defined by orthogonally projecting the light-permeable sheet onto the top surface of the sensor chip is located inside of the connection pads and is spaced apart the connection pads by a distance; and a plurality of metal wires that are respectively connected to the bonding pads of the substrate and the connection pads of the sensor chip so as to establish an electrical connection between the substrate and the sensor chip.

6. The sensor package structure according to claim 5, wherein each of the columnar microstructures is a triangular column, a circular column, or a rectangular column.

7. The sensor package structure according to claim 5, wherein the upper surface of the substrate and a bending point of any one of the metal wires have a largest distance therebetween that is greater than an interval distance between the light-permeable sheet and the substrate.

8. The sensor package structure according to claim 5, further comprising an encapsulant formed on the upper surface of the substrate, wherein the sensing module and the metal wires are embedded in the encapsulant, and an outer surface of the light-permeable sheet is at least partially exposed from the encapsulant.

9. The sensor package structure according to claim 8, wherein the sensor chip, the light-permeable sheet, and an outer lateral edge of the annular adhering layer jointly define an annular groove that is fully filled with the encapsulant.

* * * * *